US012090563B2

(12) United States Patent
Mizumoto

(10) Patent No.: US 12,090,563 B2
(45) Date of Patent: Sep. 17, 2024

(54) LASER REFLOW METHOD

(71) Applicant: DISCO CORPORATION, Tokyo (JP)

(72) Inventor: Yuta Mizumoto, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 46 days.

(21) Appl. No.: 18/175,676

(22) Filed: Feb. 28, 2023

(65) Prior Publication Data
US 2023/0278124 A1 Sep. 7, 2023

(30) Foreign Application Priority Data

Mar. 4, 2022 (JP) .................................. 2022-033703

(51) Int. Cl.
| | |
|---|---|
| B23K 26/00 | (2014.01) |
| B23K 1/00 | (2006.01) |
| B23K 1/005 | (2006.01) |
| B23K 26/03 | (2006.01) |
| B23K 26/04 | (2014.01) |
| B23K 101/40 | (2006.01) |

(52) U.S. Cl.
CPC ............ *B23K 1/0056* (2013.01); *B23K 26/03* (2013.01); *B23K 26/04* (2013.01); *B23K 2101/40* (2018.08)

(58) Field of Classification Search
CPC .............. B23K 1/0056; B23K 2101/40; B23K 26/032; B23K 26/067; B23K 26/073; H01L 2224/81224; H01L 2224/81815; H05K 2203/107; H05K 3/34; H05K 3/3494; G01R 31/2891
See application file for complete search history.

(56) References Cited

U.S. PATENT DOCUMENTS

| | | | | |
|---|---|---|---|---|
| 6,278,078 | B1* | 8/2001 | Walvoord | ............ H05K 3/3494 |
| | | | | 219/121.61 |
| 11,929,334 | B2* | 3/2024 | Braganca, Jr. | .......... H01L 24/03 |
| 2007/0096763 | A1* | 5/2007 | Ehrmann | ........... B23K 26/0861 |
| | | | | 324/754.03 |
| 2009/0120916 | A1* | 5/2009 | Bruce | .................. B23K 1/0056 |
| | | | | 219/121.65 |

(Continued)

FOREIGN PATENT DOCUMENTS

| | | |
|---|---|---|
| JP | 2008177240 A | 7/2008 |
| JP | 2021102217 A | 7/2021 |

*Primary Examiner* — Erin B Saad
(74) *Attorney, Agent, or Firm* — Greer Burns & Crain Ltd.

(57) ABSTRACT

A laser reflow method includes preparing a workpiece including a board and semiconductor chips each having one or more bumps formed on one surface thereof, the semiconductor chips being placed on the board with the bumps interposed therebetween. An inclination detection step captures an image of one semiconductor chip and detects an inclination of the semiconductor chip within the captured image. A laser beam irradiation step irradiates each semiconductor chip with a laser beam from another surface side opposite to the one surface to reflow the bumps formed within an irradiated range of the workpiece. A phase pattern displayed by a spatial light modulator is rotated in such a manner as to agree with the inclination of the detected semiconductor chip, to thereby rotate an irradiation range of the laser beam within an irradiated surface of the workpiece, before the semiconductor chips are irradiated with the laser beam.

3 Claims, 6 Drawing Sheets

(56) References Cited

U.S. PATENT DOCUMENTS

| | | | |
|---|---|---|---|
| 2009/0319075 A1* | 12/2009 | Tian | G01N 21/9501 |
| | | | 700/121 |
| 2010/0277760 A1* | 11/2010 | Matsunaga | G06T 1/00 |
| | | | 358/1.15 |
| 2015/0037984 A1* | 2/2015 | Zhang | B23K 26/067 |
| | | | 438/799 |
| 2017/0100794 A1* | 4/2017 | Wu | B23K 1/19 |
| 2020/0091108 A1* | 3/2020 | Kim | B23K 3/00 |
| 2020/0094336 A1* | 3/2020 | Ikushima | H05K 3/34 |
| 2021/0202431 A1* | 7/2021 | Kobayashi | B23K 26/0665 |

* cited by examiner

LASER REFLOW METHOD

BACKGROUND OF THE INVENTION

Field of the Invention

The present invention relates to a laser reflow method.

Description of the Related Art

In a semiconductor device manufacturing process, as a method for electrically connecting chips and external terminals to each other, there has been known a flip-chip packaging technology in which electrodes on the chips are made to face and connect to electrodes on a package board with bumps interposed therebetween.

In general, the flip-chip packaging technology adopts, for example, a mass reflow process for heating a board in its entirety to bond chips to the board or a thermo-compression bonding (TCB) process for heating and compressing chips to bond them to a board. However, the mass reflow process has a problem that it causes thermal stress due to the heating of the entire board, and the TCB process has a problem that it takes time to cool a bonder head, for example, and has poor productivity.

As a process that is more advantageous than the above processes, there is known a laser reflow process in which chips are connected to electrodes on a board through laser irradiation (refer to Japanese Patent Laid-open No. 2008-177240 and Japanese Patent Laid-open No. 2021-102217). The laser reflow process is advantageous in that it causes smaller thermal stress than in the case of the mass reflow process because the board is not heated in its entirety, and achieves higher productivity than in the case of the TCB process by applying a laser beam to a plurality of chips.

SUMMARY OF THE INVENTION

Meanwhile, in the laser reflow process described above, the laser beam is formed into a desired shape to be applied to the chips. In a case where an outer shape of each chip is quadrangular, for example, the laser beam is formed into a quadrangle to be applied to the chips. However, in a case where the chips are placed in an inclined manner with respect to the board, if the laser beam is applied to a predetermined area, only part of each chip is heated. As a result, each chip has an area where bonding is carried out and another area where bonding is not carried out, which may cause connection failures. To cope with this problem, it is possible to adopt a method in which alignment of irradiation positions is carried out by mounting a holding table that has a rotational axis to a laser beam irradiation apparatus and rotating the holding table according to the inclination of the chips on each occasion, but it takes time to control the rotational axis, which lowers productivity.

Accordingly, it is an object of the present invention to provide a laser reflow method which can restrain connection failures while improving the yield.

In accordance with an aspect of the present invention, there is provided a laser reflow method for connecting semiconductor chips to a board with use of a laser beam irradiation apparatus including a laser beam source, an image focusing assembly for focusing an image of a laser beam emitted from the laser beam source, and a spatial light modulator that is disposed between the laser beam source and the image focusing assembly and that modulates the laser beam emitted from the laser beam source, according to a phase pattern, and emits the modulated laser beam. The laser reflow method includes a preparation step of preparing a workpiece including the board and the semiconductor chips each having one or more bumps formed on one surface thereof, the semiconductor chips being placed on the board with the bumps interposed therebetween, an inclination detection step of capturing an image of one semiconductor chip placed on the board and detecting an inclination of the semiconductor chip within the captured image, and a laser beam irradiation step of irradiating each semiconductor chip with the laser beam from another surface side opposite to the one surface to reflow the bumps formed within an irradiated range of the workpiece. In the laser beam irradiation step, the phase pattern displayed by the spatial light modulator is rotated in such a manner as to agree with the inclination of the semiconductor chip detected in the inclination detection step, to thereby rotate an irradiation range of the laser beam within an irradiated surface of the workpiece, before the semiconductor chips are irradiated with the laser beam.

Preferably, in the inclination detection step, a straight line existing within the captured image is detected to detect the inclination of the semiconductor chip. Preferably, the image focusing assembly is provided as an image focusing function included in the spatial light modulator.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

A preferred embodiment of the present invention will be described in detail below with reference to the accompanying drawings. It is to be noted that the present invention is not limited to the details of the embodiment described below. Further, components described below cover those which could easily be envisaged by those skilled in the art and those which are essentially identical to those described. Moreover, arrangements described below can be used in appropriate combinations. Various omissions, replacements, or changes of the arrangements may be made without departing from the scope of the present invention.

Figure 1:
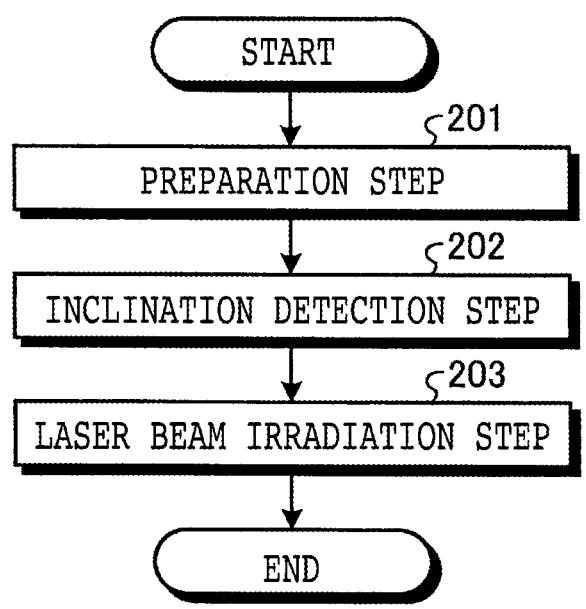
FIG. 1 is a flowchart illustrating a flow of a laser reflow method according to an embodiment of the present invention.

A laser reflow method according to the embodiment of the present invention will be described with reference to the accompanying drawings. FIG. 1 is a flowchart illustrating a flow of the laser reflow method according to the embodiment. As illustrated in FIG. 1, the laser reflow method includes a preparation step 201, an inclination detection step 202, and a laser beam irradiation step 203.

(Preparation Step 201)

Figure 2:
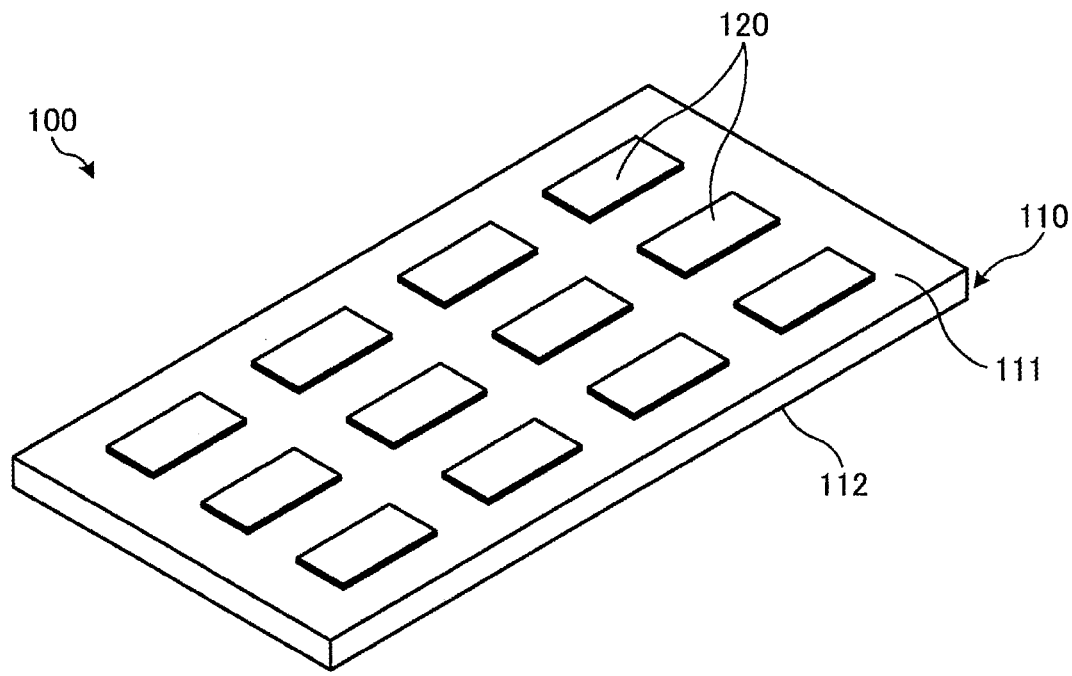
FIG. 2 is a perspective view of a workpiece prepared in a preparation step illustrated in FIG. 1.
Figure 3:
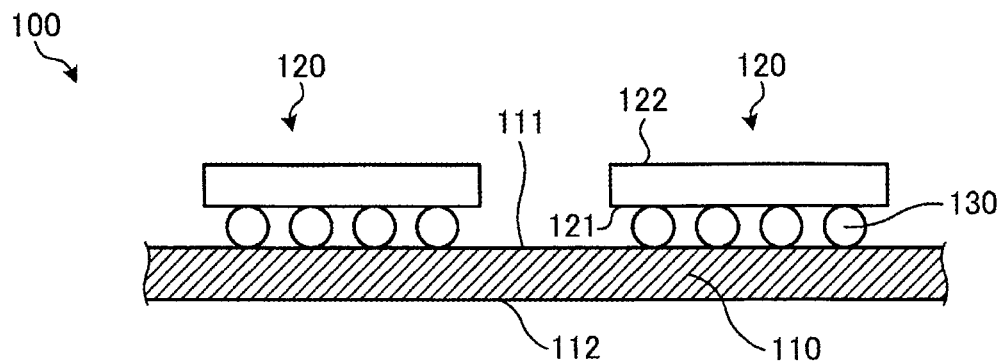
FIG. 3 is a cross-sectional view of essential parts of the workpiece illustrated in FIG. 2.

FIG. 2 is a perspective view of a workpiece 100 prepared in the preparation step 201 illustrated in FIG. 1. FIG. 3 is a cross-sectional view of essential parts of the workpiece 100 illustrated in FIG. 2. As illustrated in FIG. 2 and FIG. 3, the workpiece 100 includes a board 110 and a plurality of semiconductor chips 120 each having one or more bumps 130.

The preparation step 201 is a step of preparing the workpiece 100 having the semiconductor chips 120 placed on the board 110. Each of the semiconductor chips 120 has one surface (a front surface 121) with the bumps 130 formed thereon and another surface (a back surface 122) opposite to the one surface. The board 110 has a front surface 111 and a back surface 112. The semiconductor chips 120 are placed on the front surface 111 side of the board 110 with the bumps 130 interposed therebetween, such that the one surfaces (the front surfaces 121) of the semiconductor chips 120 face downward and the front surface 111 of the board 110 faces upward.

The board 110 in the embodiment has a rectangular shape. The board 110 is, for example, a printed circuit board (PCB) or a device wafer that is to be divided into chips. The plurality of semiconductor chips 120 are arranged on the front surface 111 side of the board 110 with the bumps 130 interposed therebetween. The semiconductor chips 120 each have one or more bumps 130 formed on the front surface 121 thereof. Each bump 130 is a terminal formed in a manner protruding from the front surface 121 of one semiconductor chip 120.

The semiconductor chips 120 are electrically connected to electrodes on the board 110 when the bumps 130 are heated and melted. That is, the workpiece 100 prepared in the preparation step 201 is scheduled to have the bumps 130 reflowed by a laser beam 21 (refer to FIG. 5) to thereby have the semiconductor chips 120 flip-chip bonded to the board 110.

It is to be noted that the workpiece 100 may be, for example, a workpiece in which the semiconductor chips 120 are arranged on the board 110 with the bumps 130 interposed therebetween as in the embodiment, or a workpiece in which a plurality of semiconductor chips 120 are stacked and bumps 130 exist between each adjacent ones of the semiconductor chips 120.

(Laser Beam Irradiation Apparatus)

Figure 4:
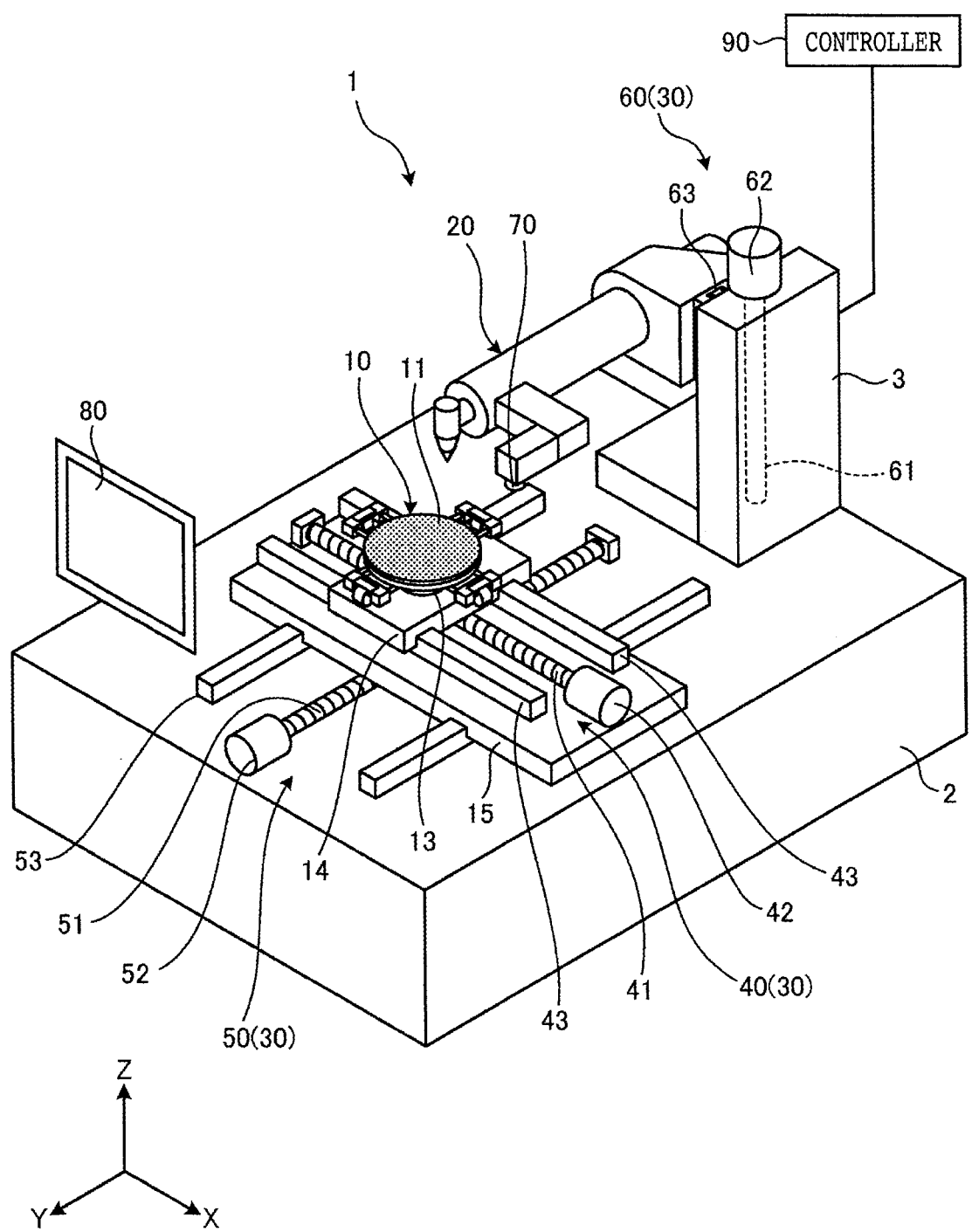
FIG. 4 is a perspective view illustrating a configuration example of a laser beam irradiation apparatus that carries out an inclination detection step and a laser beam irradiation step illustrated in FIG. 1.
Figure 5:
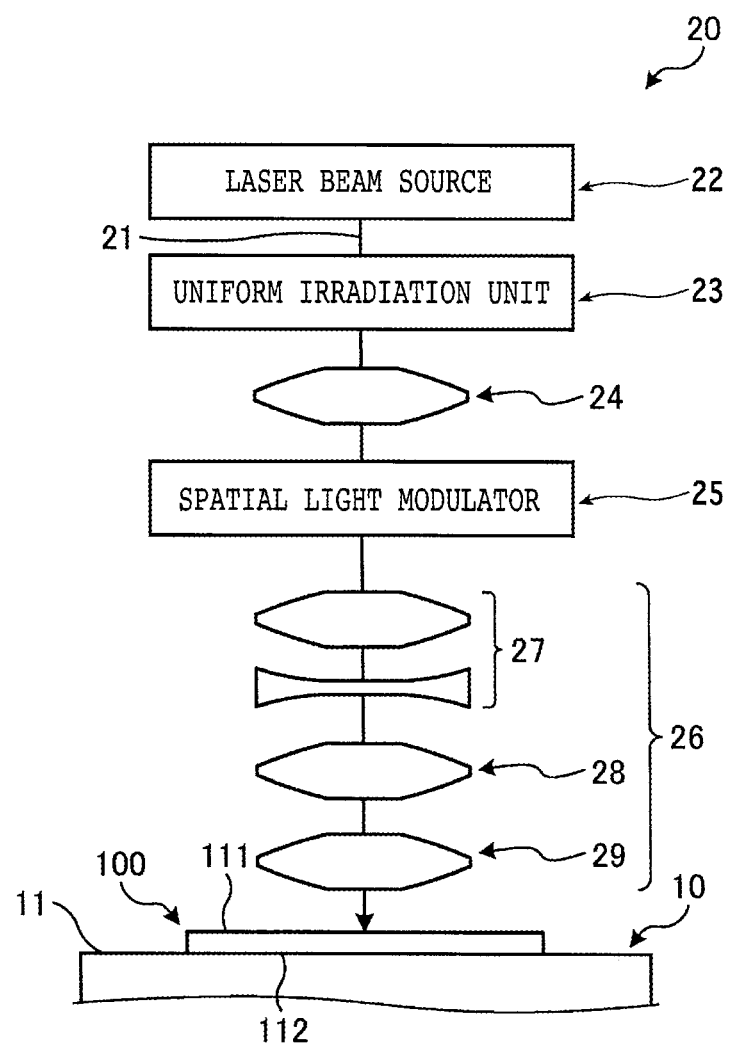
FIG. 5 is a view illustrating a configuration example of an optical system included in the laser beam irradiation apparatus illustrated in FIG. 4.

FIG. 4 is a perspective view illustrating a configuration example of a laser beam irradiation apparatus 1 that carries out the inclination detection step 202 and the laser beam irradiation step 203 illustrated in FIG. 1. FIG. 5 is a view illustrating a configuration example of an optical system included in the laser beam irradiation apparatus 1 illustrated in FIG. 4. It is to be noted that, in the description below, an X-axis direction denotes a direction in a horizontal plane, a Y-axis direction denotes a direction orthogonal to the X-axis direction in the horizontal plane, and a Z-axis direction denotes a direction orthogonal to both the X-axis direction and the Y-axis direction.

The laser beam irradiation apparatus 1 according to the embodiment is an apparatus that irradiates, with the laser beam 21, the semiconductor chips 120 placed on the board 110 of the workpiece 100 held on a holding table 10 to reflow the bumps 130, thereby connecting the semiconductor chips 120 to the board 110. The laser beam irradiation apparatus 1 according to the embodiment includes the holding table 10, a laser beam irradiation unit 20, a moving unit 30, an imaging unit 70, a display unit 80, and a controller 90.

The holding table 10 holds the workpiece 100 by a holding surface 11 thereof. The holding surface 11 is in a disk shape and includes porous ceramics or the like. The holding surface 11 is a plane that lie in parallel to a horizontal direction in the embodiment. The holding surface 11 is, for example, connected to a vacuum suction source through a vacuum suction path. The holding table 10 holds under suction the workpiece 100 placed on the holding surface 11.

The holding table 10 is rotated about its axis extending in parallel to the Z-axis direction by a rotation unit 13. The rotation unit 13 is supported on an X-axis direction movable plate 14. The rotation unit 13 and the holding table 10 are moved in the X-axis direction by an X-axis direction moving unit 40 of the moving unit 30 through the medium of the X-axis direction movable plate 14. The rotation unit 13 and the holding table 10 are also moved in the Y-axis direction by a Y-axis direction moving unit 50 of the moving unit 30 through the medium of the X-axis direction movable plate 14, the X-axis direction moving unit 40, and a Y-axis direction movable plate 15.

The laser beam irradiation unit 20 is a unit for irradiating the workpiece 100 held on the holding table 10 with the laser beam 21. As illustrated in FIG. 5, the laser beam irradiation unit 20 includes a laser beam source 22, a uniform irradiation unit 23, a light guide unit 24, a spatial light modulator 25, and an image focusing assembly 26.

The laser beam source 22 emits the laser beam 21. The laser beam source 22 is in the form of, for example, a fiber laser, a single light source having a single laser diode (LD), or a multiple light source having a plurality of laser diodes arranged therein. The laser beam 21 emitted from the laser beam source 22 is a continuous wave (CW) having a wavelength that can be absorbed by the workpiece 100 (the semiconductor chips 120).

The uniform irradiation unit 23 is arranged at a subsequent stage of the laser beam source 22. The uniform irradiation unit 23 acts to form a uniform irradiation surface on the spatial light modulator 25, which will be described later, with the laser beam 21 emitted from the uniform irradiation unit 23. The laser beam 21 has a uniform power density in the uniform irradiation surface.

In a case where the laser beam source 22 is a multiple light source, it is particularly preferable to incorporate the uniform irradiation unit 23 in the laser beam irradiation unit 20. Also in a case where the laser beam source 22 is a single light source, if the light source has a Gaussian distribution, the uniform irradiation unit 23 should preferably be incorporated for achieving a complete top-hat distribution. Furthermore, also in a case where the laser beam source 22 is a light source having a top-hat distribution, the uniform irradiation unit 23 should preferably be incorporated for achieving a more complete top-hat distribution.

Examples of the uniform irradiation unit 23 include a combination of a collimator lens and an aspherical lens for forming a uniform irradiation surface; a combination of a collimator lens, a diffractive optical element (DOE), and a condensing lens for forming a uniform irradiation surface; a combination of a rod lens (a tubular member made of glass) or a light pipe (a hollow tubular member surrounded by a mirror, also referred to as a homogenizer rod) and a light guide unit (a relay lens or an optical fiber) for forming a uniform irradiation surface; and a combination of a collimator lens, first and second lens arrays (each including an array of rod lenses or a lens having a surface processed into an array of lenses), and a condensing lens for forming a uniform irradiation surface.

The light guide unit 24 is a unit for transferring light of the uniform irradiation surface formed by the uniform irradiation unit 23 to the spatial light modulator 25. It is to be noted that, in a case where the laser beam irradiation unit 20 does not include the uniform irradiation unit 23, the light guide unit 24 transfers light directly from the laser beam source 22 to the spatial light modulator 25. The light guide unit 24 is, for example, an optical fiber or a relay lens (a set of lenses).

The spatial light modulator 25 is disposed between the laser beam source 22 and the image focusing assembly 26. The spatial light modulator 25 including a spatial light modulation element modulates the laser beam 21 emitted from the laser beam source 22, according to a phase pattern to be displayed, and emits the modulated beam. The spatial light modulator 25, or what is generally called a spatial light modulator (SLM), controls a spatial density distribution of an intensity (a power density) of the emitted laser beam 21 to modulate the laser beam 21.

The spatial light modulator 25 changes the phase pattern to be displayed, thereby changing a shape of an irradiated range of the workpiece 100 when the workpiece 100 is irradiated with the laser beam 21. The spatial light modulator 25 may be selected from any known SLM devices including a known reflective liquid-crystal-on-silicon (LCOS) device, a transmissive liquid-crystal panel (LCP), a deformable mirror, and a digital micro-mirror device (DMD), for example. The spatial light modulator 25 in the embodiment is an LCOS device.

The image focusing assembly 26 focuses an image of the laser beam 21 incident thereon on an irradiated surface of the workpiece 100. The laser beam irradiation unit 20 according to the embodiment focuses an image of the laser beam 21, with use of the image focusing assembly 26, on an area in the workpiece 100 held on the holding table 10, the area corresponding to the back surface 122 of each semiconductor chip 120. It is to be noted that, in the laser beam irradiation unit 20, laser irradiation may be carried out simultaneously for a plurality of semiconductor chips 120. The image focusing assembly 26 in the embodiment includes an image focusing system 27, a magnifying image focusing lens 28, and a telecentric lens 29.

The image focusing system 27 is a single lens or an image focusing lens including a set of lenses, and in the example illustrated in FIG. 5, includes a double-convex lens and a double-concave lens that are successively arranged. It is to be noted that, in a case where the spatial light modulation element of the spatial light modulator 25 also has a function as the image focusing system 27 (the image focusing lens), the image focusing system 27 may be omitted.

The magnifying image focusing lens 28 magnifies an image (a conjugate image) focused by the image focusing system 27 and focuses the magnified image on the irradiated surface of the workpiece 100. It is to be noted that the magnifying image focusing lens 28 may be omitted.

The telecentric lens 29 causes the laser beam 21 to enter the irradiated surface of the workpiece 100 perpendicularly, i.e., in parallel to its optical axis. It is to be noted that the image focusing system 27 may be configured as the telecentric lens 29, and alternatively, the optical system may be configured with the telecentric lens 29 omitted therefrom.

The moving unit 30 illustrated in FIG. 4 is a unit for moving the holding table 10 and the laser beam irradiation unit 20 relative to each other. The moving unit 30 includes the X-axis direction moving unit 40, the Y-axis direction moving unit 50, and a Z-axis direction moving unit 60.

The X-axis direction moving unit 40 is a unit for moving the holding table 10 and the laser beam irradiation unit 20 relative to each other in the X-axis direction. In the embodiment, the X-axis direction moving unit 40 moves the holding table 10 in the X-axis direction. The X-axis direction moving unit 40 in the embodiment is installed above an apparatus main body 2 of the laser beam irradiation apparatus 1.

The X-axis direction moving unit 40 supports the X-axis direction movable plate 14 in such a manner as to be movable in the X-axis direction. The X-axis direction moving unit 40 in the embodiment includes a known ball screw 41, a known pulse motor 42, and known guide rails 43. The ball screw 41 is rotatable about its central axis. The pulse motor 42 rotates the ball screw 41 about the central axis. The guide rails 43 support the X-axis direction movable plate 14 in such a manner as to be movable in the X-axis direction. The guide rails 43 are fixed to the Y-axis direction movable plate 15.

The Y-axis direction moving unit 50 is a unit for moving the holding table 10 and the laser beam irradiation unit 20 relative to each other in the Y-axis direction. In the embodiment, the Y-axis direction moving unit 50 moves the holding table 10 in the Y-axis direction. The Y-axis direction moving unit 50 in the embodiment is installed on the apparatus main body 2 of the laser beam irradiation apparatus 1.

The Y-axis direction moving unit 50 supports the Y-axis direction movable plate 15 in such a manner as to be movable in the Y-axis direction. The Y-axis direction moving unit 50 in the embodiment includes a known ball screw 51, a known pulse motor 52, and known guide rails 53. The ball screw 51 is rotatable about its central axis. The pulse motor 52 rotates the ball screw 51 about the central axis. The guide rails 53 support the Y-axis direction movable plate 15 in such a manner as to be movable in the Y-axis direction. The guide rails 53 are fixed to the apparatus main body 2.

The Z-axis direction moving unit 60 is a unit for moving a focused spot of the laser beam 21 focused by the image focusing assembly 26 illustrated in FIG. 5, in an optical axis direction. The optical axis direction agrees with the Z-axis direction that is orthogonal to the holding surface 11 of the holding table 10. The Z-axis direction moving unit 60 moves the holding table 10 and at least the image focusing assembly 26 of the laser beam irradiation unit 20 relative to each other in the Z-axis direction. The Z-axis direction moving unit 60 in the embodiment is installed to an upright wall section 3 standing on the apparatus main body 2 of the laser beam irradiation apparatus 1.

The Z-axis direction moving unit 60 supports at least the image focusing assembly 26 of the laser beam irradiation unit 20 in such a manner as to be movable in the Z-axis direction. The Z-axis direction moving unit 60 in the embodiment includes a known ball screw 61, a known pulse motor 62, and known guide rails 63. The ball screw 61 is rotatable about its central axis. The pulse motor 62 rotates the ball screw 61 about the central axis. The guide rails 63 support the laser beam irradiation unit 20 in such a manner as to be movable in the Z-axis direction. The guide rails 63 are fixed to the upright wall section 3.

The imaging unit 70 captures an image of the workpiece 100 held on the holding surface 11 of the holding table 10. The imaging unit 70 includes a charge-coupled device (CCD) camera or an infrared camera for capturing an image of the workpiece 100 held on the holding surface 11. The imaging unit 70 is fixed, for example, at a position adjacent to the image focusing assembly 26 (refer to FIG. 5) of the laser beam irradiation unit 20. The imaging unit 70 captures an image of the workpiece 100 to obtain a captured image 71 (refer to FIG. 7) containing an outline 123 of one semiconductor chip 120, and outputs the captured image 71 thus obtained to the controller 90.

The display unit 80 is a display section including a liquid-crystal display device or the like. The display unit 80 causes a screen image for setting processing conditions, the captured image 71 obtained by the imaging unit 70, and states of processing actions, for example, to be displayed on its display surface. In a case where the display surface of the display unit 80 includes a touch panel, the display unit 80 may include an input section. The input section can receive various kinds of operation inputs such as an input made by an operator to register information of processing details. The input section may be an external input device such as a keyboard. The information and images displayed on the display surface of the display unit 80 can be changed in response to operation made through the input section or the like. The display unit 80 may include an alarm device. The alarm device notifies the operator of the laser beam irradiation apparatus 1 of predetermined alarm information by issuing at least either sound or light. The alarm device may be an external alarm device such as a speaker or a light emitting device.

The controller 90 controls the respective components described above in the laser beam irradiation apparatus 1 to cause the laser beam irradiation apparatus 1 to carry out processing actions on the workpiece 100. The controller 90 controls the laser beam irradiation unit 20, the moving unit 30, the imaging unit 70, and the display unit 80. The controller 90 is a computer including an arithmetic processing device as arithmetic processing means, a storage device as storage means, and an input/output interface device as communication means. The arithmetic processing device includes a microprocessor such as a central processing unit (CPU), for example. The storage device includes a memory such as a read only memory (ROM) or a random access memory (RAM). The arithmetic processing device carries out various types of arithmetic processing operation on the basis of predetermined programs stored in the storage device. According to results of the arithmetic processing operation, the arithmetic processing device outputs various types of control signals to the respective components via the input/output interface device, thereby controlling the laser beam irradiation apparatus 1.

The storage device of the controller 90 stores, for example, at least one phase pattern to be displayed by the spatial light modulator 25 of the laser beam irradiation unit 20. Examples of the phase pattern stored in the storage device include a phase pattern obtained by modulating the laser beam 21 in such a manner as to be imaged on the irradiated range of the workpiece 100 held on the holding table 10, the irradiated range corresponding to each semiconductor chip 120. Examples of the phase pattern stored in the storage device also include a phase pattern that is obtained when the semiconductor chips 120 do not have an inclination 74 to be described later and that serves as a reference. The arithmetic processing device, for example, rotates the phase pattern to be displayed, according to the inclination 74 of the semiconductor chips 120 to be described later. It is to be noted that the storage device may store a plurality of phase patterns corresponding to various irradiation ranges, and alternatively, the storage device may store only one phase pattern in a case where only rotation of the irradiation range is carried out.

(Inclination Detection Step 202)

Figure 6:
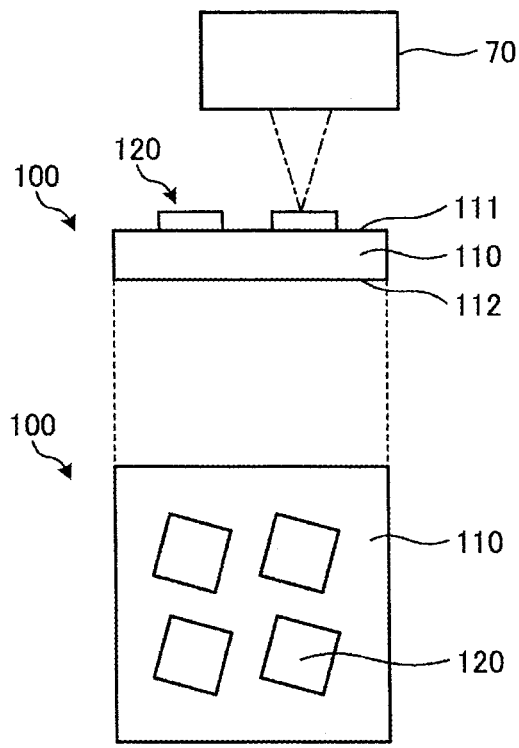
FIG. 6 is a view illustrating an example of the inclination detection step illustrated in FIG. 1.
Figure 7:
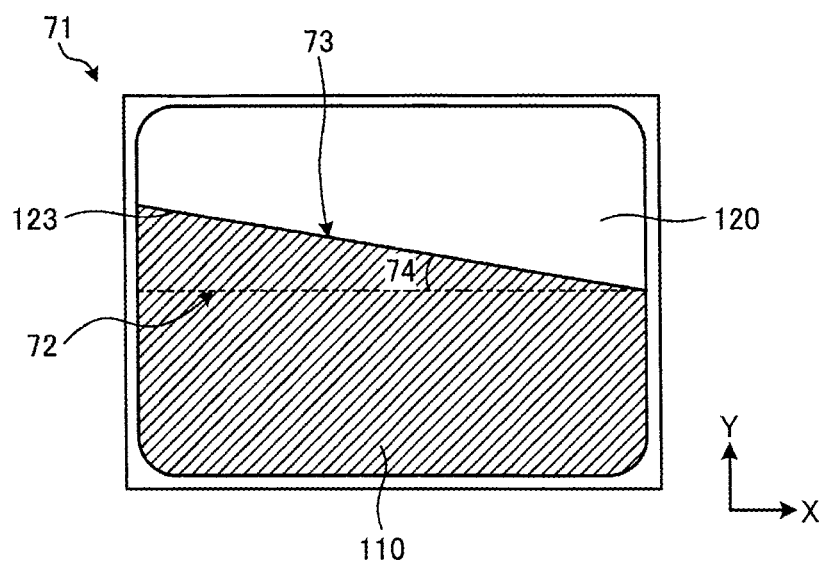
FIG. 7 is a view illustrating an example of a captured image captured in the inclination detection step of FIG. 6.

FIG. 6 is a view illustrating an example of the inclination detection step 202 illustrated in FIG. 1. FIG. 7 is a view illustrating an example of the captured image 71 captured in the inclination detection step 202 of FIG. 6. The inclination detection step 202 is a step of capturing an image of the semiconductor chips 120 placed on the board 110 and detecting an inclination 74 of the semiconductor chips 120 within the captured image 71. The inclination detection step 202 according to the embodiment is carried out by the laser beam irradiation apparatus 1 illustrated in FIG. 4.

In the inclination detection step 202, first, the workpiece 100 is placed and held on the holding surface 11 of the holding table 10. In this regard, the board 110 of the workpiece 100 is held at the back surface 112 thereof on the holding surface 11 and has the semiconductor chips 120 placed on the front surface 111 thereof with the bumps 130 interposed therebetween. Next, the imaging unit 70 captures an image of the workpiece 100 held on the holding table 10 as illustrated in FIG. 6, to obtain the captured image 71 containing the outline 123 of one semiconductor chip 120 as illustrated in FIG. 7, and outputs the captured image 71 thus obtained to the controller 90.

The captured image 71 contains a reference line 72. The reference line 72 according to the embodiment is, for example, a line that passes through the center of the captured image 71 and that extends in parallel to the X-axis direction. It is to be noted that, in a case where the reference line 72 is a line extending in parallel to the X-axis direction, the captured image 71 containing a part of the outline 123 of one semiconductor chip 120 which part extends substantially in the X-axis direction is obtained in the inclination detection step 202.

In the inclination detection step 202, the controller 90 detects a straight line 73 existing within the obtained captured image 71. The straight line 73 here corresponds to the outline 123 of the semiconductor chip 120. The straight line 73 can be obtained, for example, using the Hough transform on the basis of coordinate values of a plurality of points constituting the outline 123 which is a boundary between the semiconductor chip 120 and the board 110 within the captured image 71.

The controller 90 then calculates the inclination 74 of the straight line 73, i.e., an angle formed between the reference line 72 and the straight line 73. The inclination 74 corresponds an inclination of the outline 123 of the semiconductor chip 120 with respect to the X-axis direction. That is, in the inclination detection step 202, the inclination 74 is regarded as the inclination of the semiconductor chip 120 with respect to the X-axis direction.

(Laser Beam Irradiation Step 203)

Figure 8:
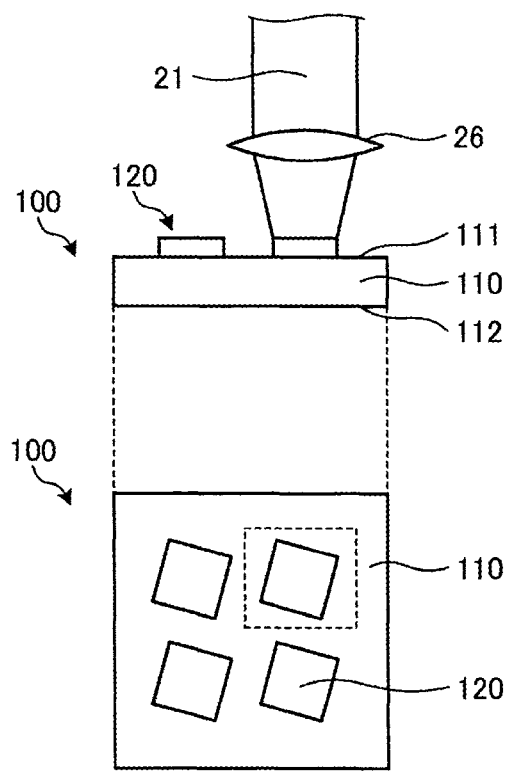
FIG. 8 is a view illustrating an example of the laser beam irradiation step illustrated in FIG. 1.
Figure 9:
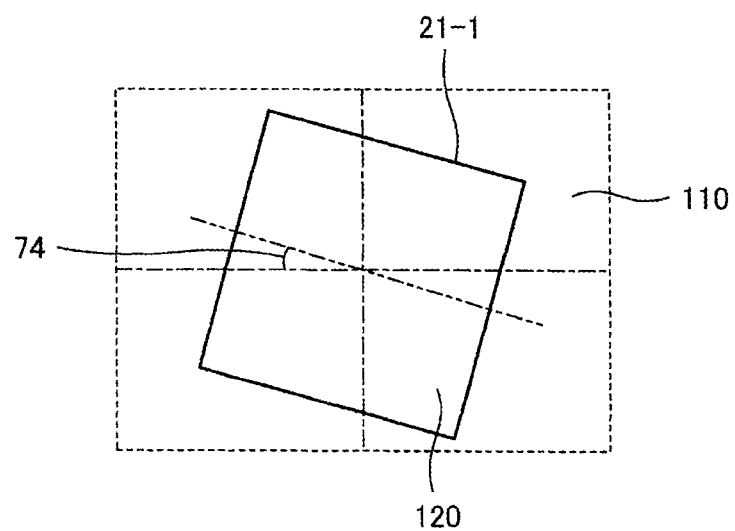
FIG. 9 is a view illustrating an irradiation range of a laser beam applied in the laser beam irradiation step of FIG. 8.

FIG. 8 is a view illustrating an example of the laser beam irradiation step 203 illustrated in FIG. 1. FIG. 9 is a view illustrating an irradiation range 21-1 of the laser beam 21 applied in the laser beam irradiation step 203 of FIG. 8. The laser beam irradiation step 203 is a step of irradiating the semiconductor chips 120 with the laser beam 21 to reflow the bumps 130 formed within the irradiated range of the workpiece 100. The laser beam irradiation step 203 according to the embodiment is carried out by the laser beam irradiation apparatus 1 having the optical system illustrated in FIG. 5.

In the laser beam irradiation step 203, first, the phase pattern displayed by the spatial light modulator 25 of the laser beam irradiation unit 20 is rotated in such a manner as to agree with the inclination 74 of the semiconductor chip 120 detected in the inclination detection step 202. As a result, as illustrated in FIG. 9, the irradiation range 21-1 of the laser beam 21 is rotated within the irradiated surface of the workpiece 100 by an angle corresponding to the inclination 74.

Next, in the laser beam irradiation step 203, the semiconductor chip 120 is irradiated with the laser beam 21 from the back surface 122 side. In this case, since the phase pattern displayed by the spatial light modulator 25 has been rotated on the basis of the inclination 74 of the semiconductor chip 120 detected in the inclination detection step 202, the irradiation range 21-1 of the laser beam 21 is in a shape that is inclined with respect to the X-axis direction and that agrees with the shape of the semiconductor chip 120. In the laser beam irradiation step 203 according to the embodiment, the workpiece 100 is irradiated with the laser beam 21 for one second.

Consequently, the bumps 130 formed within the irradiation range 21-1 of the laser beam 21 is reflowed. Since the irradiation range 21-1 of the laser beam 21 is inclined with respect to the X-axis direction by the angle corresponding to the inclination 74, the irradiated range of the workpiece 100 irradiated with the laser beam 21 agrees with the shape of the semiconductor chip 120. Accordingly, the bumps 130 formed on the one surface (the front surface 121) side of the semiconductor chip 120 irradiated with the laser beam 21 are reflowed, so that the semiconductor chip 120 is bonded to the board 110.

As described above, the laser reflow method according to the embodiment can, even if the semiconductor chips 120 are placed on the board 110 in an inclined manner, irradiate the entire area of each semiconductor chip 120 with the laser beam 21 by rotating the irradiation range 21-1 of the laser beam 21 according to the inclination 74 of the semiconductor chips 120.

For example, in the mass reflow process, even if semiconductor chips are placed in an inclined manner with respect to the board, when bumps and flux are melted due to heat, all the chips are self-aligned. Meanwhile, in the laser reflow method according to the embodiment, too, the bumps 130 arranged on the semiconductor chips 120 can uniformly be heated and melted, and the surface tension of the melted bumps 130 induces self-alignment of the semiconductor chips 120.

Accordingly, in the laser reflow method according to the embodiment, since only a range corresponding to each semiconductor chip 120 is irradiated with the laser beam 21, thermal stress is reduced in comparison with the case of adopting the mass reflow process in which the board 110 is heated in its entirety, and the semiconductor chips 120 are disposed at appropriate positions on the board 110, which can restrain connection failures while improving the yield.

It is to be noted that the present invention is not limited to the embodiment described above. That is, various changes of the embodiment may be made without departing from the gist of the present invention. For example, while the image focusing assembly 26 in the embodiment includes the image focusing system 27, the magnifying image focusing lens 28, and the telecentric lens 29 which are provided separately from the spatial light modulator 25, the image focusing assembly 26 may otherwise be provided as an image focusing function included in the spatial light modulator 25.

Furthermore, the laser reflow method may additionally include a decision step of deciding whether or not there is an inclination 74, after the inclination detection step 202 is carried out. When it is decided in this decision step that there is no inclination 74, laser irradiation is carried out without rotating the phase pattern.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A laser reflow method for connecting semiconductor chips to a board with use of a laser beam irradiation apparatus including a laser beam source, an image focusing assembly for focusing an image of a laser beam emitted from the laser beam source, and a spatial light modulator that is disposed between the laser beam source and the image focusing assembly and that modulates the laser beam emitted from the laser beam source, according to a phase pattern, and emits the modulated laser beam, the laser reflow method comprising:

a preparation step of preparing a workpiece including the board and the semiconductor chips each having one or more bumps formed on one surface thereof, the semiconductor chips being placed on the board with the bumps interposed therebetween;

an inclination detection step of capturing an image of one semiconductor chip placed on the board and detecting an inclination of the semiconductor chip within the captured image; and a laser beam irradiation step of irradiating each semiconductor chip with the laser beam from another surface side opposite to the one surface to reflow the bumps formed within an irradiated range of the workpiece, wherein, in the laser beam irradiation step, the phase pattern displayed by the spatial light modulator is rotated in such a manner as to agree with the inclination of the semiconductor chip detected in the inclination detection step, to thereby rotate an irradiation range of the laser beam within an irradiated surface of the workpiece, before the semiconductor chips are irradiated with the laser beam.

2. The laser reflow method according to claim 1, wherein, in the inclination detection step, a straight line existing within the captured image is detected to detect the inclination of the semiconductor chip.

3. The laser reflow method according to claim 1, wherein, the image focusing assembly is provided as an image focusing function included in the spatial light modulator.

* * * * *